(12) United States Patent
Lee et al.

(10) Patent No.: US 9,189,027 B2
(45) Date of Patent: Nov. 17, 2015

(54) FOLDABLE DISPLAY DEVICE

(71) Applicant: Samsung Display Co., Ltd., Yongin, Gyeonggi-Do (KR)

(72) Inventors: Kyu-Taek Lee, Cheonan-si (KR); Kyu Young Kim, Suwon-si (KR); Gui-Nam Min, Hwaseong-si (KR); Jongin Lee, Seoul (KR); Kyung Woo Han, Seoul (KR); Soyeon Han, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 75 days.

(21) Appl. No.: 14/175,713

(22) Filed: Feb. 7, 2014

(65) Prior Publication Data

US 2015/0049428 A1 Feb. 19, 2015

(30) Foreign Application Priority Data

Aug. 19, 2013 (KR) .................. 10-2013-0098078

(51) Int. Cl.
*G06F 1/16* (2006.01)
*G09G 5/00* (2006.01)

(52) U.S. Cl.
CPC ............ *G06F 1/1652* (2013.01); *G06F 1/1641* (2013.01)

(58) Field of Classification Search
CPC .......................... G06F 1/1652; G06F 1/1641
USPC ............ 361/679.01–679.45, 679.55–679.59; 345/1.1, 1.3, 3.1
See application file for complete search history.

(56) References Cited

U.S. PATENT DOCUMENTS

| | | | |
|---|---|---|---|
| 6,016,176 A * | 1/2000 | Kim et al. ..................... 349/84 |
| 6,377,324 B1 * | 4/2002 | Katsura ......................... 349/58 |
| 6,577,496 B1 * | 6/2003 | Gioscia et al. ............ 361/679.3 |
| 8,039,102 B1 | 10/2011 | Lavature et al. |
| 8,194,399 B2 * | 6/2012 | Ashcraft et al. ......... 361/679.05 |
| 8,873,225 B2 * | 10/2014 | Huitema et al. ......... 361/679.01 |
| 2004/0096708 A1 | 5/2004 | Bottger et al. |
| 2006/0223398 A1 | 10/2006 | Citterio et al. |
| 2007/0091232 A1 | 4/2007 | Kim et al. |
| 2007/0097014 A1 * | 5/2007 | Solomon et al. ............... 345/1.1 |
| 2010/0033818 A1 | 2/2010 | Petcavich et al. |
| 2010/0201603 A1 | 8/2010 | Kee et al. |
| 2011/0241998 A1 * | 10/2011 | McKinney et al. ........... 345/168 |
| 2011/0291923 A1 * | 12/2011 | Tong ............................. 345/156 |
| 2012/0014054 A1 | 1/2012 | Ashcraft et al. |

(Continued)

FOREIGN PATENT DOCUMENTS

| | | |
|---|---|---|
| JP | 4793230 B2 | 8/2011 |
| JP | 2012-78570 A | 4/2012 |
| WO | WO 2012/042822 A1 | 4/2012 |

OTHER PUBLICATIONS

Extended European Search Report dated Nov. 3, 2014 for European Patent Application No. EP 14 162 907.1 which shares priority of Korean Patent Application No. KR 10-2015-0098078.

*Primary Examiner* — Nidhi Thaker

(74) *Attorney, Agent, or Firm* — Knobbe, Martens, Olson & Bear, LLP

(57) ABSTRACT

A foldable display device is disclosed. In one aspect, the foldable display device includes a display panel and a window panel provided on a front surface of the display panel. The window panel includes a flexible area and a rigid area provided adjacent to at least one side of the flexible area. The elastic modulus of the flexible area of the window panel is lower than that that of the rigid area.

34 Claims, 19 Drawing Sheets

(56) References Cited

U.S. PATENT DOCUMENTS

| | | |
|---|---|---|
| 2012/0192466 A1 | 8/2012 | Kee et al. |
| 2012/0262870 A1 * | 10/2012 | Leung .................. 361/679.27 |
| 2013/0308076 A1 | 11/2013 | Yasumatsu |

* cited by examiner

FOLDABLE DISPLAY DEVICE

CROSS-REFERENCE TO RELATED APPLICATIONS

This U.S. non-provisional patent application claims priority under 35 U.S.C. §119 to Korean Patent Application No. 10-2013-0098078, filed on Aug. 19, 2013, in the Korean Intellectual Property Office, the entire contents of which are hereby incorporated by reference in its entirety.

BACKGROUND

1. Field

The described technology generally relates to a display device, and in particular, to a foldable display device.

2. Description of the Related Technology

The standard display device includes a flat-panel display panel, such as a liquid crystal display (LCD), a field emission display (FED), a plasma display panel (PDP), or an organic light-emitting diode (OLED) display, and is often used in television sets, mobile phones or the like. Recently, a variety of other uses for display panels including a flexible substrate have been suggested.

The use of a flexible substrate makes it possible to realize an electronic product with a foldable display device. For example, a foldable display device may be used for mobile applications, such as mobile phones, portable multimedia players (PMPs), navigation systems, ultra mobile PC (UMPC), electronic books, and electronic newspapers, as well as for a variety of large-screen applications, such as television sets and monitors.

SUMMARY OF CERTAIN INVENTIVE ASPECTS

One inventive aspect is a foldable display device with an improved durability and flexibility.

Another aspect is a foldable display device including a display panel and a window panel provided on a front surface of the display panel. The window panel includes a flexible area and a rigid area provided adjacent to at least one side of the flexible area. The elastic modulus of the window panel may be lower in the flexible area than in the rigid area.

The flexible area extends along a folding line, which is an imaginary line along which the window panel is folded.

The window panel may include a plurality of layers including at least one first layer, the first layer has an elastic modulus different from those of the other layers, and the thicknesses of the first layer are different in the rigid area and the flexible area.

The window panel may be provided with two or more layers with different thicknesses in the rigid area and the flexible area. In this case, as the elastic modulus of the respective layers decreases, the thickness thereof in the flexible area increases, and the total thickness of the window panel may be substantially uniform.

The window panel may include a first layer and a second layer covering the first layer and having an elastic modulus larger than the first layer and the first layer may have a greater thickness in the flexible area than in the rigid area. In this case, the first layer may include a convex portion in the flexible area protruding toward the second layer. The convex portion extends in a direction substantially parallel to the folding line and has a shape of a polygon, a portion of a circle, or a portion of an ellipse, on a sectional view.

A plurality of convex portions may be provided. In this case, the density of the convex portions decreases as the distance from the folding line increases. Further, the height of the convex portions decreases as the distance from the folding line increases.

The display panel may include one of a liquid crystal display panel, an organic electroluminescence display panel, an electrophoresis display panel, or an electrowetting display panel.

The display panel may include a display area and a non-display area provided adjacent to at least one side of the display area and at least a portion of the flexible area may or may not substantially overlap the display area.

Another aspect is a foldable display device including a display panel including a base substrate including a flexible area exhibiting flexibility and at least one rigid area provided adjacent to at least one side of the flexible area and an image display layer provided on the base substrate. The base substrate has an elastic modulus that may be lower in the flexible area than in the rigid area.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

DETAILED DESCRIPTION OF CERTAIN INVENTIVE EMBODIMENTS

Figure 1:
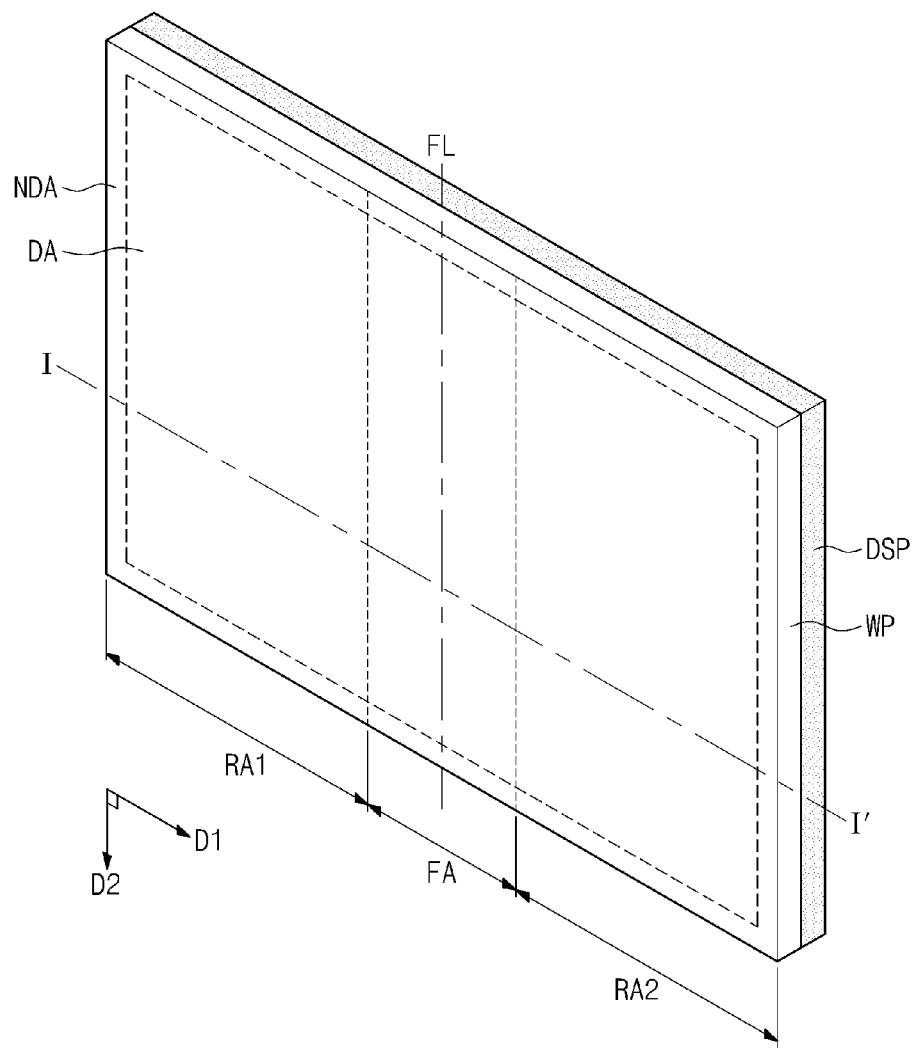
FIG. 1 is an exploded perspective view illustrating a foldable display device according to an exemplary embodiment.

It should be noted that the accompanying figures are intended to illustrate the general characteristics of methods, structure and/or materials utilized in certain exemplary embodiments and to supplement the written description provided below. These drawings are, however, not to scale and may not precisely reflect the precise structural or performance characteristics of any given embodiment. Thus, the drawings should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Exemplary embodiments of the described technology will now be described more fully with reference to the accompanying drawings, in which exemplary embodiments are shown. Exemplary embodiments of the described technology may, however, be embodied in many different forms and should not be construed as being limited to the embodiments set forth herein; rather, these embodiments are provided so that this disclosure will be thorough and complete, and will fully convey the concept of the described technology to those of ordinary skill in the art. In the drawings, the thicknesses of layers and regions may be exaggerated for clarity. Like reference numerals in the drawings denote like elements, and thus redundant descriptions thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of described technology.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of the stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the described technology belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an exploded perspective view illustrating a foldable display device according to an exemplary embodiment.

Figure 2A:
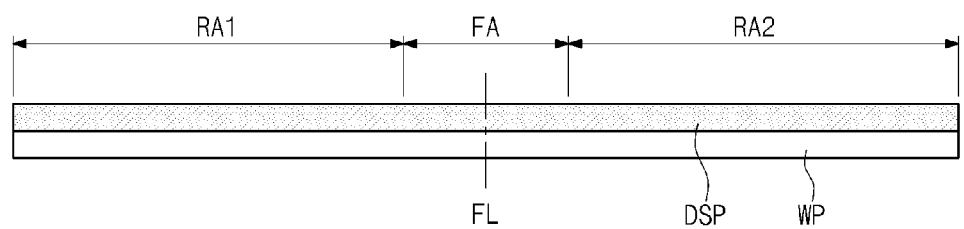
FIG. 2A is a sectional view taken along line I-I' of FIG. 1 to illustrate the foldable display device.
Figure 2B:
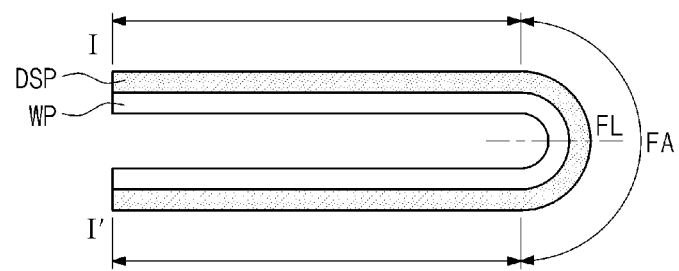
FIG. 2B is a sectional view illustrating the foldable display device of FIG. 1 in a folded state.

FIG. 2A is a sectional view taken along line I-I' of FIG. 1 and FIG. 2B is a sectional view illustrating the foldable display device of FIG. 1 in a folded state.

A foldable display device displays visual information (e.g., text, video, picture, 2D or 3D images, and so forth). Hereinafter, such visual information will be referred as to an "image".

The foldable display device may have various shapes or structures. For example, as illustrated in FIGS. 1, 2A, and 2B, the foldable display device may include two substantially rectangular plates, each of which has two pairs of substantially parallel sides. In the case that the foldable display device has a substantially rectangular shape, one pair of sides may be longer than the other pair of sides. However, the foldable display device may have various other shapes, such a substantially square shape, a substantially hexagonal shape, etc.

In order to avoid redundancy in the drawings and to provide better understanding of the exemplary embodiments, the description that follows will refer to a foldable display device having a pair of long sides and a pair of short sides and thereby having a substantially rectangular shape. Further, first and second directions D1 and D2 will be used to represent directions substantially parallel to the long and short sides, respectively.

The foldable display device may include at least a portion having flexibility and thereby allowing the foldable display device to be folded. The foldable display device includes a flexible area FA and a rigid area RA provided adjacent to at least one side of the flexible area FA. According to some embodiments, the rigid area RA has no flexibility or has substantially less flexibility than the flexible area. Because of the flexibility, the foldable display is foldable along a specific imaginary line. The imaginary line where the foldable display is folded is referred to as a "folding line FL". The folding line FL is provided in the flexible area FA. According to some embodiments, the folding line FL passes through the center of the flexible area FA. As shown, the flexible area FA may be substantially symmetric with respect to the folding line FL, however, the described technology is not limited thereto. For example, the flexible area FA may be asymmetrically positioned with respect to folding line FL.

Hereinafter, terms of "foldable" and "folded" will be used to represent that the shape referred to is not fixed and can be deformed from its original shape. The term of "foldable" and "folded" will be used to represent a shape that can be folded or bent along one or more lines (e.g., the folding line FL) as well as curved or rolled. Accordingly, the foldable display device may be folded in such a way that the rigid areas thereof face each other to be substantially parallel to each other as shown in FIG. 2B. However, the described technology is not limited thereto. For example, the foldable display device may be folded in such a way that the rigid areas form a specific angle (e.g., an acute, right or obtuse angle) at the flexible area FA. Such modifications will be described below.

Further, with regard to the flexible area FA and the rigid areas RA1 and RA2, terms "flexibility", "no flexibility", "soft", and "rigid" will be used to represent relative properties of the foldable display device. For example, the term "no flexibility" or "rigid" may be used to express a substantially completely rigid state or a state having some flexibility (e.g., being less flexible compared to the flexible area FA). In some embodiments, the rigid areas RA1 and RA2 have less or no flexibility, when compared to the flexible area FA. Thus, the foldable display is not foldable in the rigid areas RA1 and RA2, but is foldable in the flexible area FA.

According to some embodiments, the first rigid area RA1, the flexible area FA, and the second rigid area RA2 are sequentially disposed along the first direction D1. The flexible area FA may have a shape elongated along the second direction D2.

In the foldable display device, the folding line FL may be provided in the flexible area FA and extend in the second direction D2, and thus, the foldable display device may be folded at the flexible area FA. In some embodiments, as the result of the folding of the foldable display device, the first and second rigid area RA1 and RA2 face each other.

In some embodiments, the first and second rigid areas RA1 and RA2 are illustrated to have the same area and the flexible area FA is illustrated to be positioned between two rigid areas, for convenience of explanation, but the described technology is not limited thereto. For example, the first and second rigid areas RA1 and RA2 may have different areas from each other. Further, the number of the rigid areas is not limited to two and may be one or three or more. For example, a plurality of rigid areas may be provided spaced apart from each other with flexible areas FA interposed therebetween.

The foldable display device may include a display panel DSP and a window panel WP.

The window panel WP is provided on a front surface of the display panel DSP, which displays images, thereby protecting the display panel DSP. The window panel WP may be positioned on the outermost portion of the foldable display device, thereby protecting the display panel DSP from external stress or impact. Further, at least a portion of the window panel WP may have flexibility, and thus, it is possible to easily fold the foldable display device. The window panel WP will be described in more detail below.

The display panel DSP displays the image and the flexible area FA thereof has flexibility. The display panel DSP may have some flexibility in the rigid areas RA1 and RA2.

The display panel DSP may include a display area DA displaying the image and a non-display area NDA provided adjacent to at least of one side of the display area DA. In some embodiments, the non-display area NDA surrounds the display area DA. In a plan view, the flexible area FA and the folding line FL thereon may substantially overlap the display area DA. Further, in the case where the foldable display device is folded, a portion displaying the image may be folded.

The display panel DSP may be any type of display panel capable of displaying an image. For example, the display panel DSP may be or include: an organic electroluminescence display panel, a liquid crystal display (LCD) panel, an electrophoresis display panel, an electro-wetting display panel, or the like. The description that follows will refer to an example in which the display panel DSP is provided in the form of the organic light-emitting diode (OLED) display panel.

Figure 3:
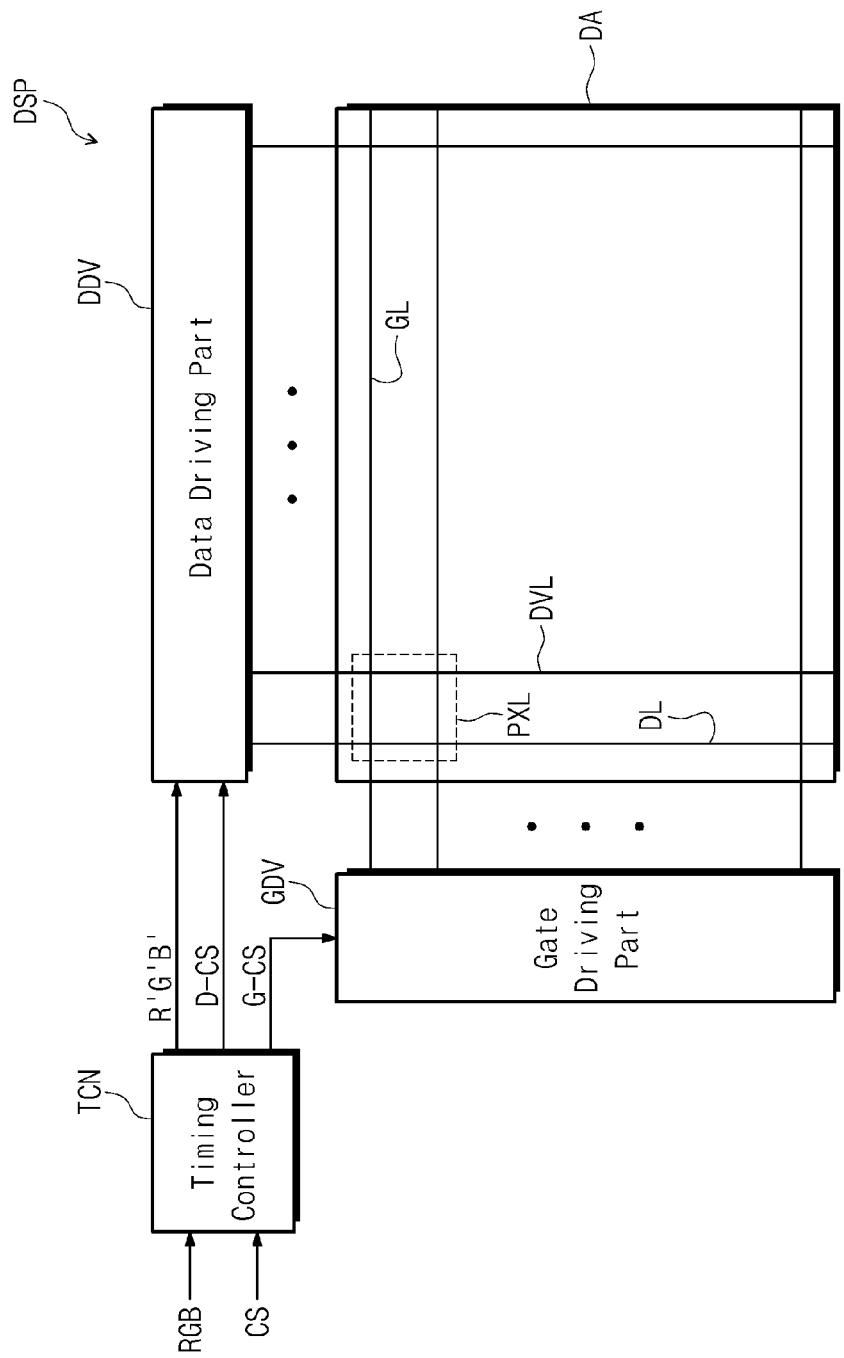
FIG. 3 is a block diagram of a display panel according to an exemplary embodiment.
Figure 4:
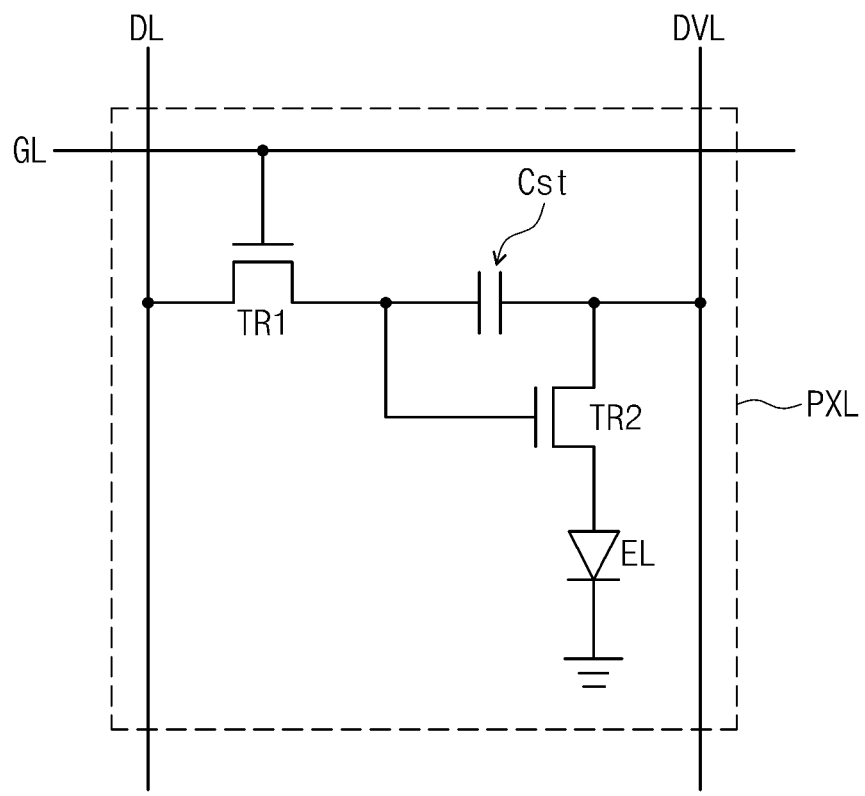
FIG. 4 is a circuit diagram of one pixel of FIG. 3.

FIG. 3 is a block diagram of a display panel DSP according to an exemplary embodiment. FIG. 4 is a circuit diagram of one of the pixels PXL of FIG. 3.

Referring to FIGS. 3 and 4, the foldable display device includes pixels PXL provided on the display area DA, gate and data driving parts (or gate and data drivers) GDV and DDV for driving the pixels PXL, and a timing controller TCN controlling operations of the gate and data driving parts GDV and DDV.

Each pixel PXL may be provided on the display area DA and include a wiring part including a gate line GL, a data line DL, and a driving voltage line DVL, a thin film transistor connected to the wiring part, an organic light-emitting diode (OLED) EL, and a capacitor Cst connected to the thin film transistor.

The gate line GL extends in a one direction. The data line DL extends in a direction crossing the gate line GL. The driving voltage line DVL extends in a direction that is substantially parallel to the data line DL. The gate line GL applies gate signals to the thin film transistor, the data line DL applies data signals to the thin film transistor, and the driving voltage line DVL provides a driving voltage to the thin film transistor.

The thin film transistor may include a driving thin film transistor TR2 for controlling the OLED EL and a switching thin film transistor TR1 for controlling a switching operation of the driving thin film transistor TR2. However, the described technology is not limited to the above example, in which each pixel PXL includes two thin film transistors TR1 and TR2. For example, each pixel PXL may include a thin film transistor and a capacitor or include three or more thin film transistors and two or more capacitors.

The gate electrode of the switching thin film transistor TR1 is connected to the gate line GL and the source electrode thereof is connected to the data line DL. The drain electrode of the switching thin film transistor TR1 is connected to the gate electrode of the driving thin film transistor TR2. The switching thin film transistor TR1 transmits data signals applied to the data line DL to the driving thin film transistor TR2, in accordance with gate signals applied to the gate line GL.

The gate electrode of the driving thin film transistor TR2 is connected to the drain electrode of the switching thin film transistor TR1, the source electrode thereof is connected to the driving voltage line DVL, and the drain electrode thereof is connected to the OLED EL.

The OLED EL may include a light-emitting layer (not shown) and first and second electrodes (not shown) facing each other. The first and second electrodes are provided spaced apart from each other with the light-emitting layer interposed therebetween. The first electrode is connected to the drain electrode of the driving thin film transistor TR2. The second electrode is applied with a common voltage. The light-emitting layer EML is configured to selectively emit light in response to an output signal of the driving thin film transistor TR2 and thereby display an image. The light-emitting layer may emit colored light or white light.

The capacitor Cst is connected between the gate electrode and the source electrode of the driving thin film transistor TR2 to preserve a data signal transmitted to the gate electrode of the driving thin film transistor TR2.

The timing controller TCN receives a plurality of image signals RGB and a plurality of control signals CS from an external source. The timing controller TCN converts the received image signals RGB in to converted image signals R'G'B' suitable for the data driving part DDV and provides the converted image signals R'G'B' to the data driving part DDV. Further, the timing controller TCN produces data control signals D-CS (e.g., an output start signal, a horizontal start signal, etc.) and gate control signals G-CS (e.g., a vertical start signal, a vertical clock signal, a vertical clock bar signal, etc.), based on the plurality of control signals CS. The data control signals D-CS is provided to the data driving part DDV, while the gate control signals G-CS is provided to the gate driving part GDV.

The gate driving part GDV sequentially outputs gate signals in response to the gate control signal G-CS received from the timing controller TCN. Accordingly, rows of pixels PX are sequentially scanned in response to the gate control signals.

The data driving part DDV outputs data signals, which are generated based on the image signals R'G'B' in response to the data control signal D-CS received from the timing controller TCN. The output data signals are be transmitted to the pixels PXL.

Each pixel PX is turned on in response to the gate signal and the data voltage received from the data driving part DDV determines the amount of light emitted from the pixel PX.

Figure 5A:
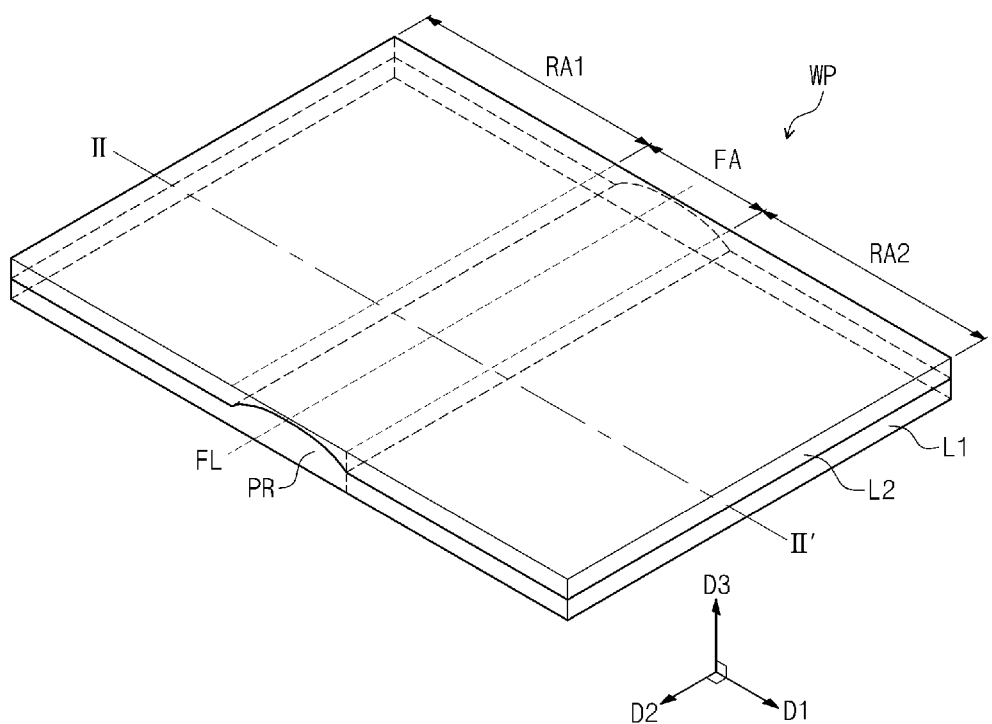
FIG. 5A is a perspective view illustrating a window panel that can be folded along a virtual folding line, according to an exemplary embodiment.
Figure 5B:
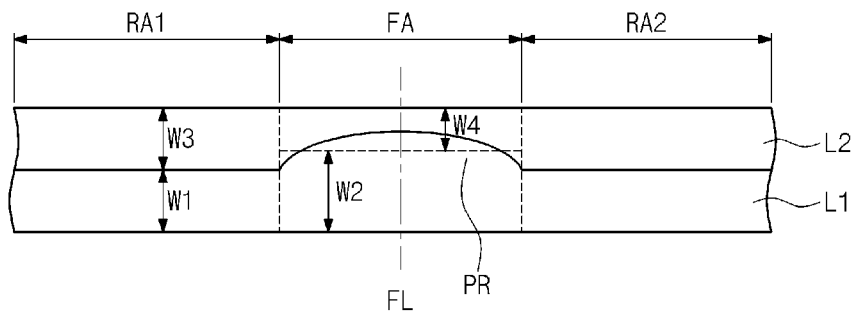
FIG. 5B is a sectional view taken along line II-II' of FIG. 5A.

FIG. 5A is a perspective view illustrating the window panel WP that can be folded along a virtual folding line FL or the second direction, according to an exemplary embodiment. FIG. 5B is a sectional view taken along line II-II' of FIG. 5A.

Referring to FIGS. 5A and 5B, the window panel WP may be provided on the front surface of the display panel DSP to protect the display panel DSP. The window panel WP may be formed of a transparent material, thereby allowing a user to see an image through the display area of the display panel DSP.

In a plan view, the window panel WP may have substantially the same shape as the display panel DSP. For example, similar to the display panel DSP, the window panel WP may have a substantially rectangular shape having long and short sides substantially parallel to the first and second directions D1 and D2, respectively. Here, the window panel WP may have a substantially uniform thickness in a third direction D3 that is substantially perpendicular to the first and second directions D1 and D2.

As shown in FIGS. 5A and 5B, in a plan view, the window panel WP includes a flexible area FA and rigid areas RA1 and RA2.

In some embodiments, the flexible area FA has a structure extending in the second direction D2 along the folding line FL. The rigid areas RA1 and RA2 may be located at both sides of the flexible area FA. For example, the rigid areas RA1 and RA2 may include a first rigid area RA1 and a second rigid area RA2 respectively disposed at both sides of the flexible area FA and the flexible area FA is located between the first and second rigid areas RA1 and RA2.

In some embodiments, the window panel WP includes a plurality of layers. For example, the window panel WP may include a first layer L1 and a second layer L2 covering a front surface of the first layer L1. Each of the first and second layers L1 and L2 may be made of an inseparable single body.

The first and second layers L1 and L2 may be formed of materials having different elastic moduli. For example, the first layer L1 may be formed of a material whose elastic modulus is lower than that of the second layer L2.

The first and second layers L1 and L2 may be formed of different polymer resins.

In some embodiments, the second layer L2 is formed of a polymer resin having a relatively high durability and a thickness ranging from several μm to about 300 μm. For example, the second layer L2 may be formed of at least one of polyimide, polycarbonate, poly(methyl methacrylate), polyethersulfone, polyamide, polyamide imide, polycarbonate-poly(methyl methacrylate) copolymer, or the like.

In some embodiments, the first layer L1 is formed of a relatively highly stretchable adhesive material (e.g., acrylic or silicone resins). The acrylic or silicone resins may be provided in the form of adhesives.

The elasticity of the window panel WP may be higher in the flexible area FA than in the first and second rigid areas RA1 and RA2. In these cases, it possible to fold the window panel WP along the flexible area FA. In other words, the window panel WP may have an elastic modulus that is lower in the flexible area FA than in the first and second rigid areas RA1 and RA2.

According to some embodiments, the first layer L1 is thicker in the flexible area FA than in the first and second rigid areas RA1 and RA2. In these cases, the second layer L2 is thinner in the flexible area FA than in the first and second rigid areas RA1 and RA2. Here, the phrase "thickness of a layer" refers to the distance between opposite surfaces of the layer. However, the phrase "thickness of a region of a layer" refers to the average of distances between opposite surfaces in the region.

Referring to FIGS. 5A and 5B, a convex portion PR is provided on the first layer L1. The convex portion PR protrudes from a surface of the first layer L1 in the flexible area FA. Here, the convex portion PR may be provided to be in contact with the second layer L2. For example, the convex portion PR may protrude in the third direction D3 that is substantially perpendicular to the first and second directions D1 and D2. A concave portion is provided in the second layer L2 to have a profile that is interlocked with the convex portion PR.

When viewed in a plan view, the convex portion PR may extend in the extension direction of the flexible area FA or the folding line FL, i.e. in the second direction D2. When viewed in a sectional view perpendicular to the extension direction of the convex portion PR, the convex portion PR may have various sectional shapes. For example, the convex portion PR may have a shape of a wave or a prism. Further, the convex portion PR may have a shape of a polygon, such as triangle, square, and rectangle, a portion of a circle, a portion of an ellipse, or a portion of a closed shape delimited by a straight line and a curved line. In order to avoid redundancy in the drawings and to provide better understanding of the exemplary embodiments, the convex portion PR is illustrated to have a substantially elliptical shape.

Referring back to FIGS. 5A and 5B, the first and second rigid areas RA1 and RA2 of the first layer L1 have a first thickness W1 and the flexible area FA of the first layer L1 has a second thickness W2. Further, the first and second rigid areas RA1 and RA2 of the second layer L2 have a third thickness W3 and the flexible area FA of the second layer L2 has a fourth thickness W4. The second thickness W2 is greater than the first thickness W1 and the third thickness W3 is greater than the fourth thickness W4.

Thus, the overall elastic modulus of the flexible area FA is lower than that of the rigid areas RA1 and RA2 because the first layer L1 having a relatively low elastic modulus has a thickness greater than the second layer L2 which has a relatively high elastic modulus. Accordingly, the flexible area FA can be easily folded compared to the rigid areas RA1 and RA2.

In the present embodiment, the thickness of the window panel WP is substantially uniform, and in this case, the sum of the first and third thicknesses W1 and W3 is substantially equal to that of the second and fourth thicknesses W2 and W4.

However, in the window panel WP, the thicknesses of the first and second layers L1 and L2 are not be limited to the above description. For example, the window panel WP may be configured in such a way that the elastic modulus thereof in the flexible area FA is lower than that in the rigid areas RA1 and RA2. In more detail, the first to fourth thicknesses W1 to W4 may be variously changed as long as they satisfy the condition of $(W3-W4)>(W1-W2)$.

The number of layers of the window panel WP is not limited to the above descriptions. For example, the window panel WP may include three or more layers. In this case, the above described relationship between the first and second layers L1 and L2 can be similarly or identically applied to a relationship between additional layers. For example, at least one of the layers may be configured in such a way that a thickness thereof in the rigid areas RA1 and RA2 is different from that in the flexible area FA.

According to at least one embodiment, a window panel with a substantially uniform thickness may be provided to cover the display panel, thereby effectively protecting the display panel. Further, the window panel may include a plurality of layers and the rigid area thereof may be configured to have a desired hardness and thereby have a high durability. Further, the flexible area of the window panel has an elastic modulus lower than that of the rigid area, and thus, has an improved flexibility compared to the conventional window panel. Accordingly, the window panel according to at least one embodiment can provide both durability and flexibility. Further, the window panel may be combined with the display panel to realize a foldable display device with both of durability and flexibility.

Figure 6:
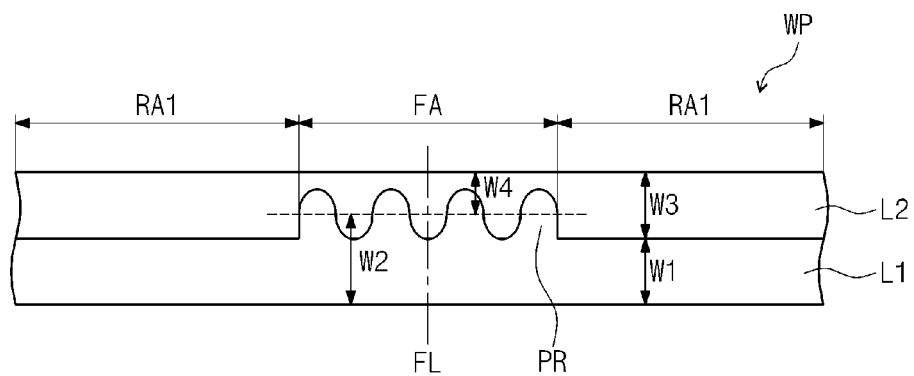
FIG. 6 is a sectional view taken along line II-II' of FIG. 5A to illustrate a window panel of a foldable display device according to another exemplary embodiment.

FIG. 6 is a sectional view taken along line II-II' of FIG. 5A to illustrate a window panel WP of a foldable display device according to another exemplary embodiment.

In the following description of the present exemplary embodiment, the elements and features of the present embodiment that are similar to those previously shown and described will not be described in much further detail in order to avoid redundancy.

Referring to FIG. 6, in a plan view, the window panel WP includes the first rigid area RA1, the second rigid area RA2, and the flexible area FA provided between the first and second rigid areas RA1 and RA2. In a sectional view, the window panel WP includes the first layer L1 and the second layer L2 covering the first layer L1. The first layer L1 may be formed to have uneven portions (e.g., a plurality of convex portions PR protruding from a surface of the first layer L1 and a plurality of concave portions between the convex portions PR) provided in the flexible area FA. In contrast, the second layer L2 may also be formed to have uneven portions provided in the flexible area FA and the uneven portions of the second layer L2 may include concave portions and convex portions PR which interlock with the convex portions PR and the concave portions of the first layer L1.

In the first layer L1, each of the convex portions PR may be provided on a surface that is in contact with the second layer L2, and thus, they may protrude in the third direction D3 that is substantially perpendicular to the first and second directions D1 and D2. When viewed in a plan view, each of the convex portions PR may extend in the extending direction of the flexible area FA or the folding line FL, i.e. the second direction D2. When viewed in a plane perpendicular to the extending direction of the convex portion PR, the sectional shape of the convex portions PR may be variously modified. For example, the convex portions PR may have a sectional shape of a polygon, such as triangle, square, or rectangle, a portion of a circle, a portion of an ellipse, or a portion of a closed shape delimited by a straight line and a curved line. In order to reduce complexity in the drawings and to provide better understanding of the described technology, the convex portions PR are illustrated to have a sectional shape like a semicircle.

The first layer L1 may be thicker in the flexible area FA than in the first and second rigid areas RA1 and RA2. The second layer L2 may be thinner in the flexible area FA than in the first and second rigid areas RA1 and RA2. Here, the thicknesses of the first and second layers L1 and L2 in the flexible area FA may refer to thicknesses in consideration of the convex portions PR and the concave portions. If, when measured from a surface of the first layer L1 in the flexible area FA, the protrusions of the convex portions PR are greater than the recesses of the concave portions, the mean thickness may be increased compared to the case where the uneven portion is not included.

Referring back to FIG. 6, the first layer L1 has a first thickness W1 in the first and second rigid areas RA1 and RA2 and the first layer L1 has a second thickness W2 in consideration of the uneven portions in the flexible area FA. The second layer L2 has a third thickness W3 in the first and second rigid areas RA1 and RA2 and the second layer L2 has a fourth thickness W4 in consideration of the uneven portions in the flexible area FA. The second thickness W2 is greater than the first thickness W1 and the third thickness W3 is greater than the fourth thickness W4. Accordingly, in the flexible area FA, the first layer L1 having a relatively low elastic modulus has a thickness greater than that of the second layer L2 which has a relatively high elastic modulus. Consequently, the overall elastic modulus of the flexible area FA may be lower than that of the rigid areas. As a result, the flexible area FA can be easily folded compared to the rigid areas RA1 and RA2.

In the present embodiment, the window panel having the above described structure may cover the entire front surface of the display panel with a substantially uniform thickness, thereby protecting the display panel. Further, the window panel may include a plurality of layers and at least one rigid area having a desired hardness, and thus, have a high durability. Further, the flexible area is provided to have an elastic modulus lower than that of the rigid area, and thus, it is possible to improve flexibility, compared to the case of the conventional window panel.

The window panel having the above described structure may be formed by forming the first layer and forming the second layer on the first layer. For example, the formation of the window panel may include forming a film having a relatively low elastic modulus, treating the film with a laser to form the first layer with concave and/or convex portions, and then, covering the first layer with a material having a relatively high elastic modulus. Alternatively, the formation of the window panel may include forming a film having a relatively high elastic modulus, treating the film with a laser to form the second layer with concave and/or convex portions, and then, forming the first layer with a material having a relatively low elastic modulus. In some embodiments, a post treatment with the laser is not performed on the first or second layer. For example, the first or second layer is formed using a cell casting process to form the concave and/or convex portions. However, the described technology is not limited to the above description, and the formation of the window panel may be variously modified.

Figure 7:
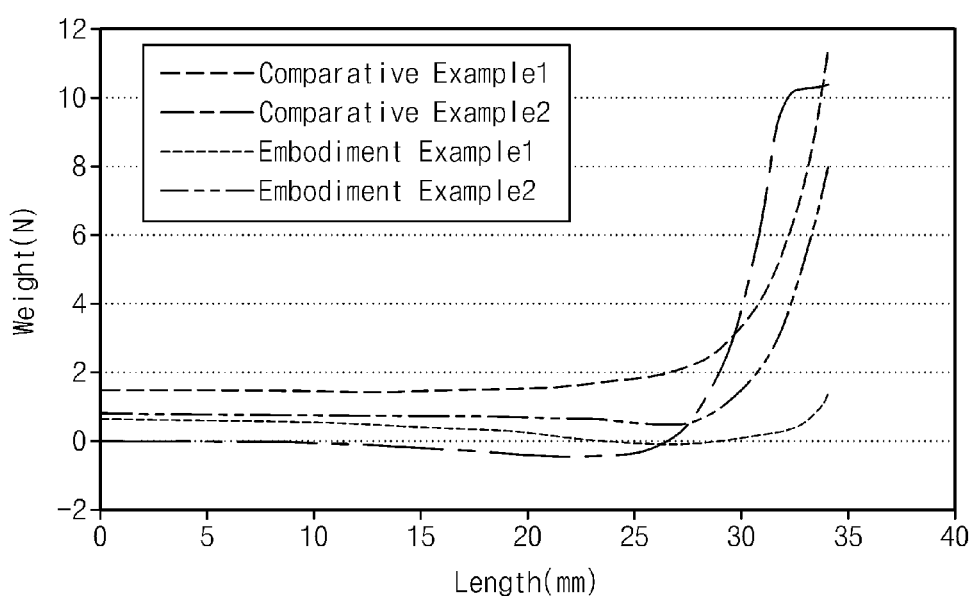
FIG. 7 is a graph showing bending stiffness properties of window panels according to comparative and exemplary embodiments.

FIG. 7 is a graph showing the bending stiffness properties of window panels according to comparative and exemplary embodiments. In the experiment, an external force was applied to one end of a vertically-standing window panel and the vertical length of the window panel was modified by the external force and measured. In the graph of FIG. 7, the x-axis represents a reduction in the vertical length of the window panel due to the external force and the y-axis represents the magnitude of the vertically-applied external force, which is associated with a restoring force of the window panel. For example, when an external force is not applied to the window panel, the length in the x-axis is about 0 mm. The end of the window panel was compressed at a speed of about 20 mm/s and the bending radius was about 3 mm.

In a comparative example 1, a window panel was configured to have two layers, whose elastic moduli are different from each other and to have a thickness of about 100 µm. In the comparative example 1, one of the layers was a base layer having a thickness of about 75 µm formed of polyethyleneterephthalate and the other was a hard coating layer having a thickness of about 25 µm In a comparative example 2, a window panel was configured to have a single layer having a thickness of about 200 µm and made of poly(methyl methacrylate), and thus, it has a single elastic modulus.

In embodiment examples 1 and 2, window panels were configured to have two layers, whose elastic moduli are different from each other, and to have a thickness of about 200 µm. The window panel of the embodiment example 1 was configured to have substantially the same technical features as that of FIG. 5 and the window panel of the embodiment example 2 was configured to have substantially the same technical features as that of FIG. 6. The maximum height of the convex portion in the embodiment example 1 was about 150 µm and the mean height of the convex portions in the embodiment example 2 was about 100 µm.

Except for the above described differences, the comparative examples 1 and 2 and the embodiment examples 1 and 2 were tested under the same conditions.

Referring to FIG. 7, in all examples, the larger the weight or external force, the larger the bending or change in vertical length of the window panel. However, for the comparative examples 1 and 2, the applied weight was abruptly increased after bending of about 25 mm or greater. For the embodiment example 2, the applied weight was increased after the bending of about 25 mm or greater but was lower than those of the comparative examples 1 and 2. The applied weight for the embodiment example 1 was particularly low (e.g., about 2N or less), even after bending of about 35 mm.

This shows that, according to exemplary embodiments of the described technology, it is possible to increase the flexibility of the window panel and thereby easily fold the window panel.

Figure 8:
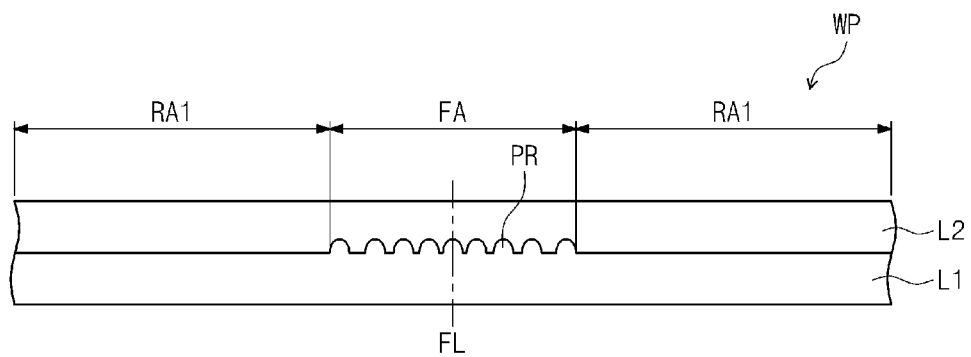
FIGS. 8 through 11 are sectional views taken along the line II-II' of FIG. 5A to illustrate window panels of foldable display devices according to other exemplary embodiments.

In the foldable display device according to exemplary embodiments, the shape of the uneven portion of the window panel may be variously modified. FIG. 8 is a sectional view taken along the II-II' of FIG. 5A to illustrate a window panel of a foldable display device according to another exemplary embodiment.

Referring to FIGS. 5A and 8, in the first layer L1, each the convex portions PR protrudes along the third direction that is substantially perpendicular to the first and second directions and extends in the extending direction of the flexible area FA or the folding line FL or the second direction D2, when viewed in a plan view. Here, the convex portions PR may be provided in such a way that the number of the convex portions PR per unit area decreases with an increasing distance from the folding line FL. In other words, when viewed in a plan view, the density of the convex portions PR may be at a maximum at the folding line FL and decrease with an increasing distance from the folding line FL. According to the present embodiment, as shown, the folding line FL is located at the center of the flexible area FA and the convex portions PR have a maximum density at the center of the flexible area FA.

Figure 9:
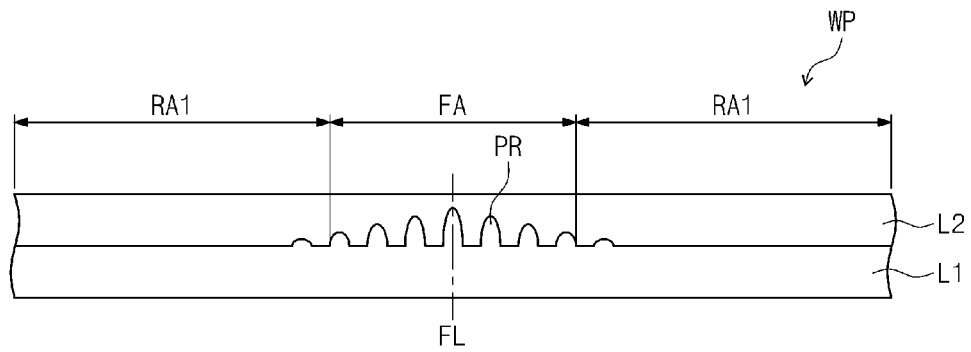

FIG. 9 is a sectional view taken along line II-II' of FIG. 5A to illustrate a window panel WP of a foldable display device according to yet another exemplary embodiment.

Referring to FIGS. 5A and 9, in the first layer L1, each the convex portions PR protrude along the third direction D3 that is substantially perpendicular to the first and second directions D1 and D2 and extends in the extending direction of the flexible area FA or the folding line FL, i.e. the second direction D2, when viewed in a plan view. Here, the convex portions PR may be provided in such a way that heights of the convex portions PR decrease with an increasing distance from the folding line FL. In other words, when viewed in a sectional view, the heights of the convex portions PR may be a maximum at the folding line FL and decrease with increasing distance from the folding line FL. According to the present embodiment, as shown, the folding line FL is located at the center of the flexible area FA and the convex portions PR have a maximum height at the center of the flexible area FA. Here, when viewed in a plan view, the convex portions PR are illustrated to have a substantially uniform density over the flexible area FA, but the described technology is not be limited thereto.

In some embodiments, the convex portions PR are provided in not only the flexible area FA but also the rigid areas RA1 and RA2 adjacent to the flexible area FA. Accordingly, it is possible to reduce stress, which may be applied between the flexible area FA and the rigid areas RA1 and RA2. Further, the convex portions PR may be locally provided in only a portion of the flexible area FA and not in the entire area of the flexible area FA.

Figure 10:
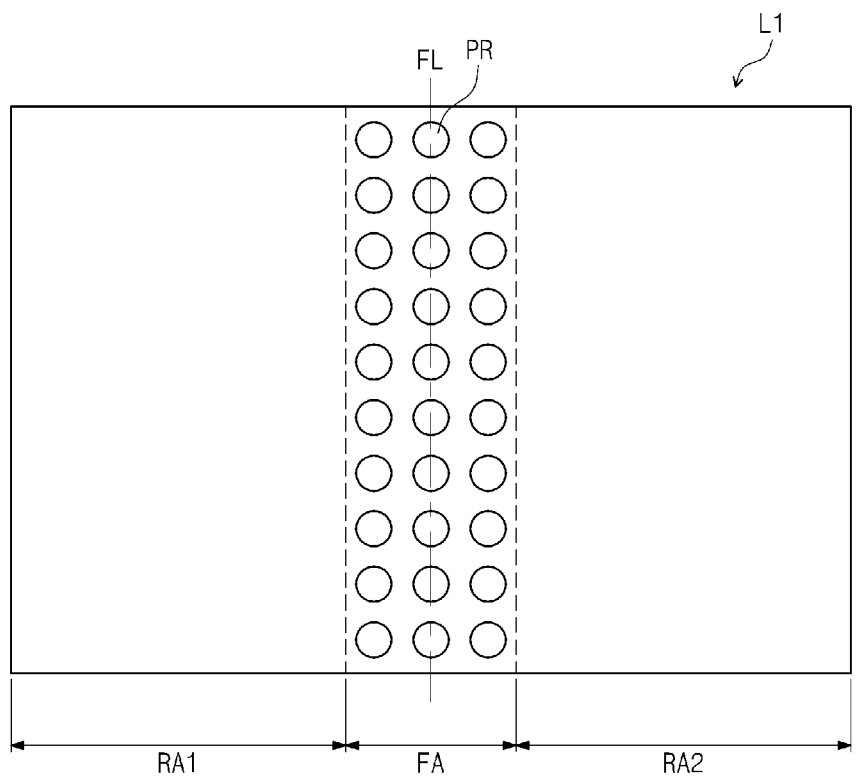

FIG. 10 is a sectional view taken along line II-II' of FIG. 5A to illustrate the first layer L1, which is provided in a window panel of a foldable display device according to yet another exemplary embodiment.

Referring to FIGS. 5A and 10, in the first layer L1, the convex portions PR are arranged spaced apart from each other in the first and second directions D1 and D2. In other words, when viewed in a plan view, each of the convex portions PR are not extended in a predetermined direction but are provided to have a shape of, for example, a semi-sphere, a semi-elliptical sphere, or a pyramid. According to some embodiments, the convex portions PR may have a substantially semispherical shape, and thus, when viewed in a plan view, each of the convex portions PR may be shaped like a circle as shown in FIG. 10. The convex portions PR may be arranged with a substantially uniform density over the entire area of the flexible area FA.

Figure 11:
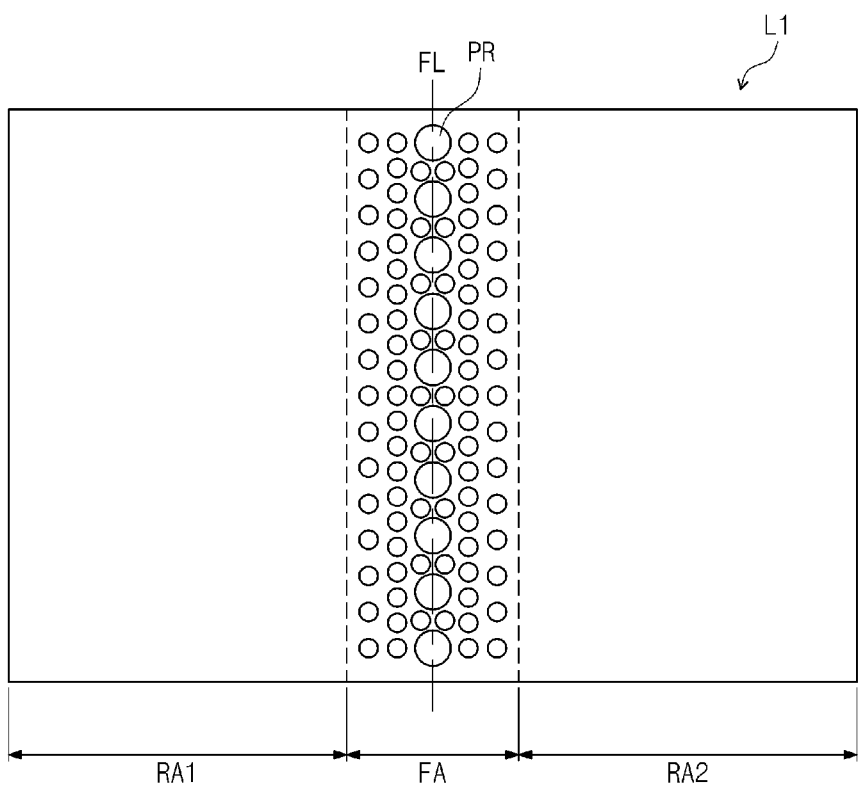

FIG. 11 is a sectional view taken along line II-II' of FIG. 5A to illustrate the first layer L1, which may be provided in a window panel of a foldable display device according to yet another exemplary embodiment.

Referring to FIGS. 5A and 11, unlike the previous embodiments of FIG. 10, the first layer L1 includes two different types of convex portions PR that are formed on a surface of the first layer L1 to have different sizes from each other. Here, the convex portions PR are provided in such a way that the mean size thereof decreases with an increasing distance from the folding line FL. For example, when viewed in a plan view, the mean size of the convex portions PR may be a maximum at the folding line FL and decrease with an increasing distance from the folding line FL.

Figure 12:
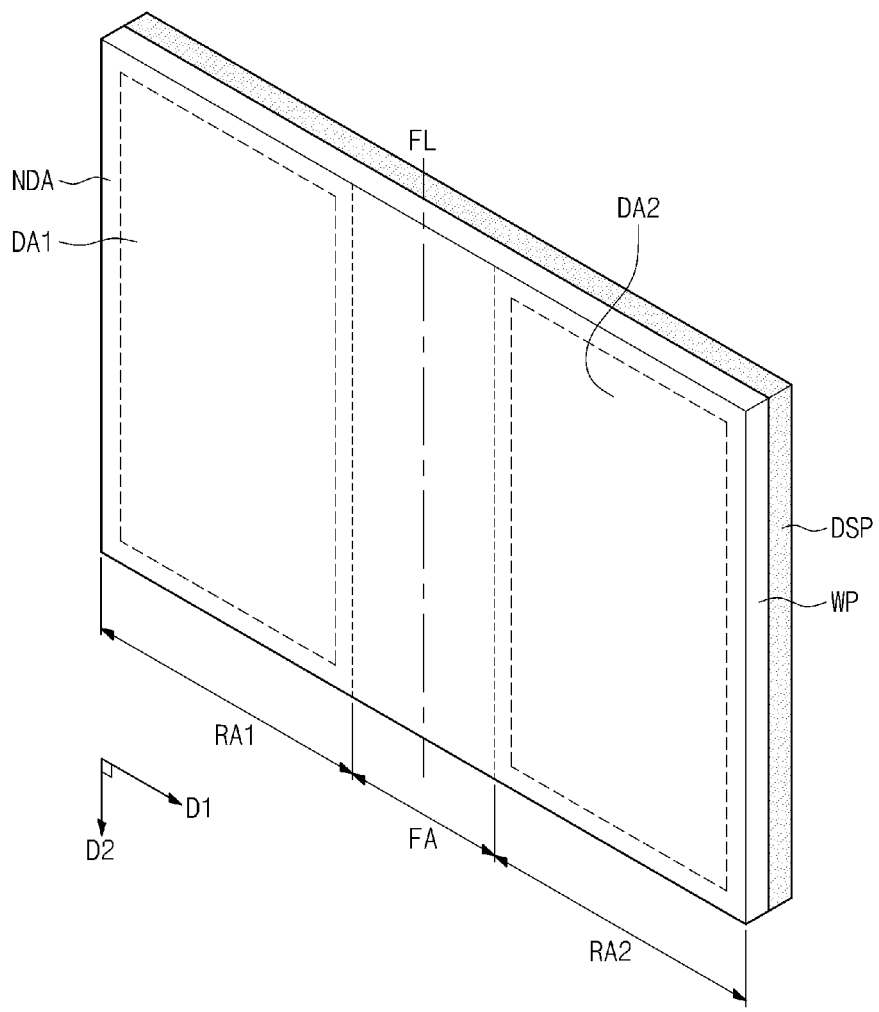
FIG. 12 is a perspective view illustrating a foldable display device according to yet another exemplary embodiment.

In the foldable display device according to some embodiments, the display area may be provided in the form of a single body that does not include portions separated from each other, however, the described technology is not limited thereto. For example, the display area may include a plurality of portions separated from each other. FIG. 12 is a perspective view illustrating a foldable display device according to exemplary embodiment.

Referring to FIG. 12, the foldable display device includes a plurality of display areas (e.g., a first display area DA1 and a second display area DA2). The non-display area NDA are provided around the first and second display areas DA1 and DA2 and the first and second display areas DA1 and DA2 are separated from each other with the non-display area NDA interposed therebetween. Here, when viewed in a plan view, the window panel WP may include the first and second rigid areas RA1 and RA2 and the flexible area FA provided between the first and second rigid areas RA1 and RA2. The flexible area FA may substantially overlap the non-display area NDA between the first and second display areas DA1 and DA2.

Figure 13:
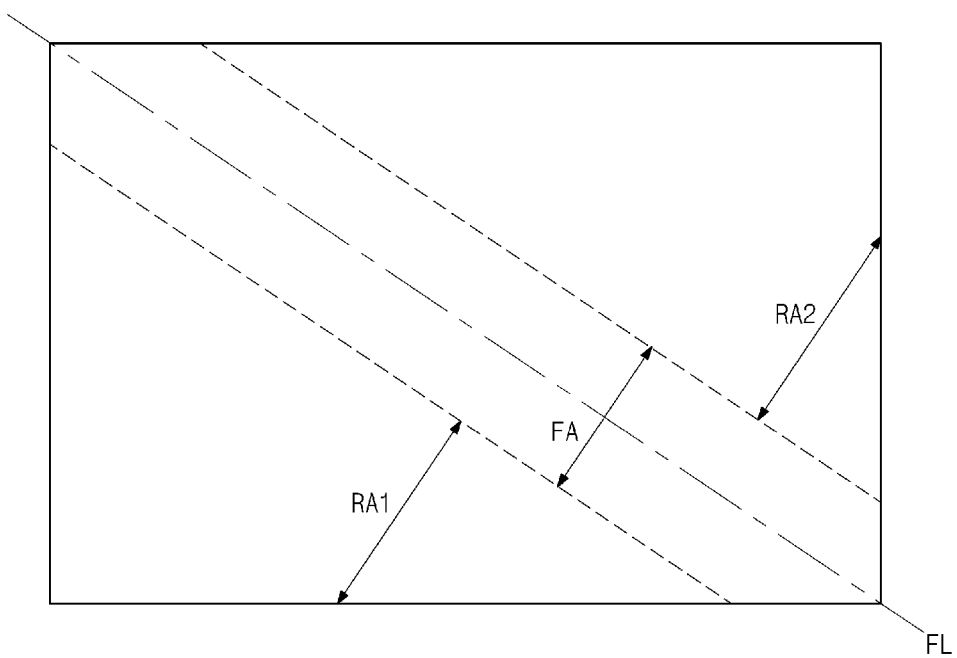
FIG. 13 is a plan view schematically illustrating a portion of a foldable display device including rigid areas, a flexible area, and a folding line, according to an exemplary embodiment.

Like the above described embodiments, the folding line may be substantially parallel to one of the sides of the foldable display device, however, the described technology is not limited thereto. For example, direction in which the folding line extends may be modified, regardless of the shape of the display device. In some embodiments, the folding line is provided at an angle to one of the sides of the display device. FIG. 13 is a plan view schematically illustrating a portion of a foldable display device including rigid areas, a flexible area, and a folding line, according to an exemplary embodiment.

Referring to FIG. 13, the foldable display device has a substantially rectangular shape and the folding line FL is provided along a diagonal direction of the rectangle. In the foldable display device, the flexible area FA may also be provided substantially parallel to the folding line FL or the diagonal direction and the first rigid area RA1 and the second rigid area RA2 may be provided at respective sides of the flexible area FA.

Figure 14A:
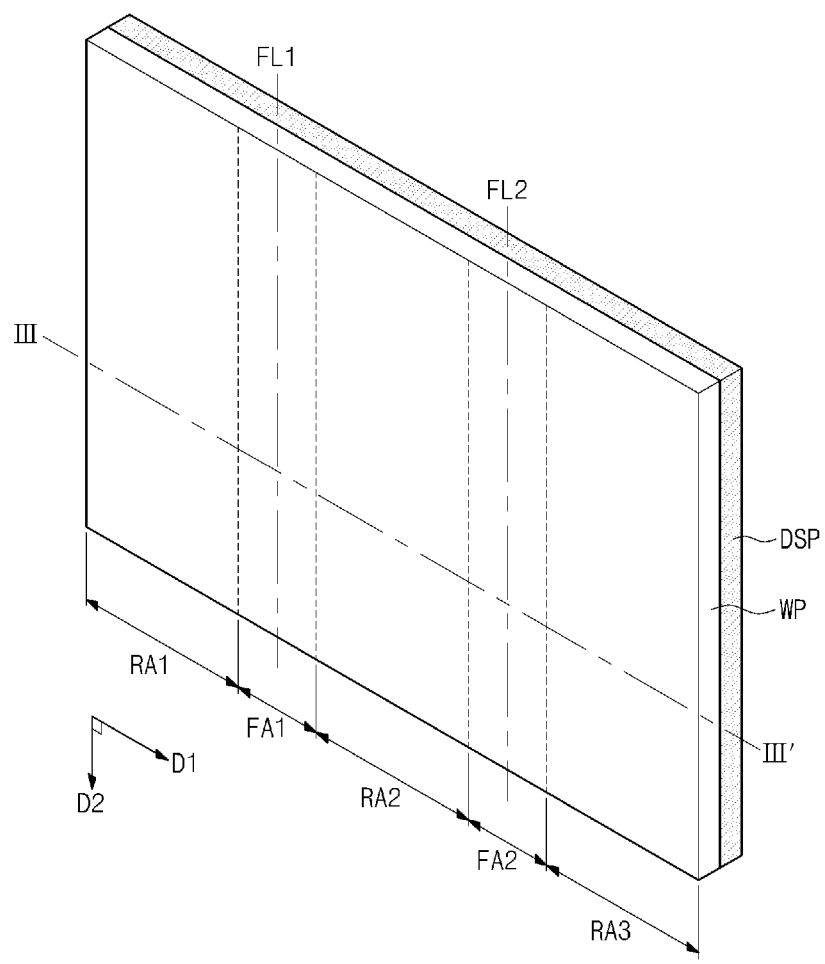
FIG. 14A is a perspective view illustrating a foldable display device according to an exemplary embodiment.

According to some embodiments, only one folding line is provided, however, the described technology is not limited thereto. That is, a plurality of folding lines may be provided in the foldable display device. FIG. 14A is a perspective view illustrating a foldable display device according to another exemplary embodiment, FIG. 14B is a perspective view illustrating the foldable display device of FIG. 14A in a folded state, and FIG. 14C is a sectional view taken along line III-III' of FIG. 14A to illustrate a window panel of the foldable display device of FIG. 14A.

Figure 14B:
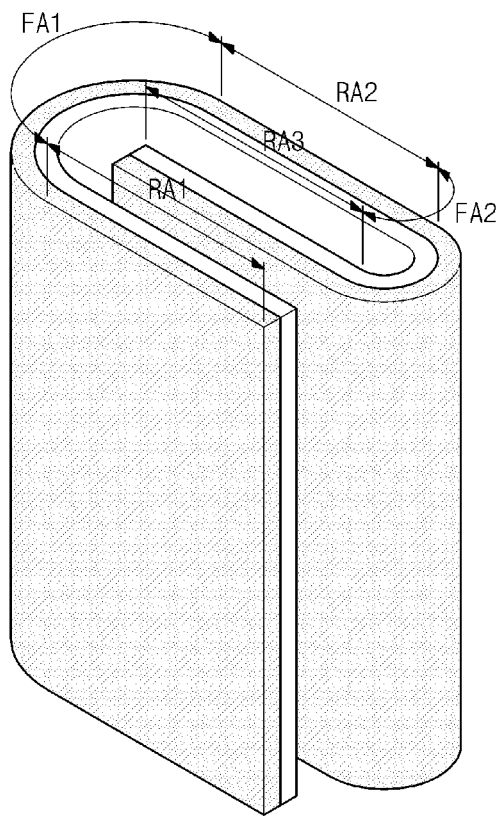
FIG. 14B is a perspective view illustrating the foldable display device of FIG. 14A in a folded state.
Figure 14C:
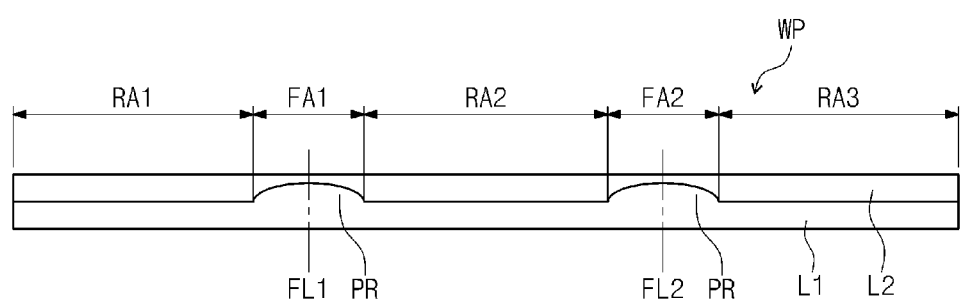
FIG. 14C is a sectional view taken along line III-III' of FIG. 14A to illustrate a window panel of the foldable display device of FIG. 14A.

Referring to FIGS. 14A, 14B, and 14C, a plurality of folding lines are provided in the foldable display device, and thus, the foldable display device includes a plurality of flexible areas and a plurality of rigid areas. For example, as shown, a first folding line FL1 and a second folding line FL2 are provided in the foldable display device, and consequently, a first rigid area RA1, a first flexible area FA1, a second rigid area RA2, a second flexible area FA2, and a third rigid area RA3 are sequentially disposed along the first direction D1. The first and second flexible areas FA2 are respectively provided near the first and second folding lines FL1 and FL2 and they extend in the second direction D2.

As shown in FIG. 14B, the foldable display device may be folded at the first flexible area FA1 and the second flexible area FA2. Here, FIG. 14B shows the foldable display device that is folded in such a way that the third rigid area RA3 is positioned between the first and second rigid areas RA1 and RA2, however, the described technology is not limited thereto. For example, according to some embodiments, the foldable display device is folded in such a way that the second rigid area RA2 is positioned between the first and third rigid areas RA1 and RA3.

According to some embodiments, both of the first and second folding lines FL1 and FL2 extend in the second direction D2, however, the described technology is not limited thereto. For example, the first and second folding lines FL1 and FL2 may extend in different directions. In other embodiments, the first folding line FL1 may extend in the first direction D1, while the second folding line FL2 may extend in the second direction D2. Alternatively, both of the first and second folding lines FL1 and FL2 may extend in the first direction D1. Further, the first folding line FL1 may extend in the first direction D1, while the second folding line FL2 may extend in a direction at an angle to the first folding line FL1. Such modifications can be identically or similarly applied for a foldable display device with three or more folding lines.

Figure 15A:
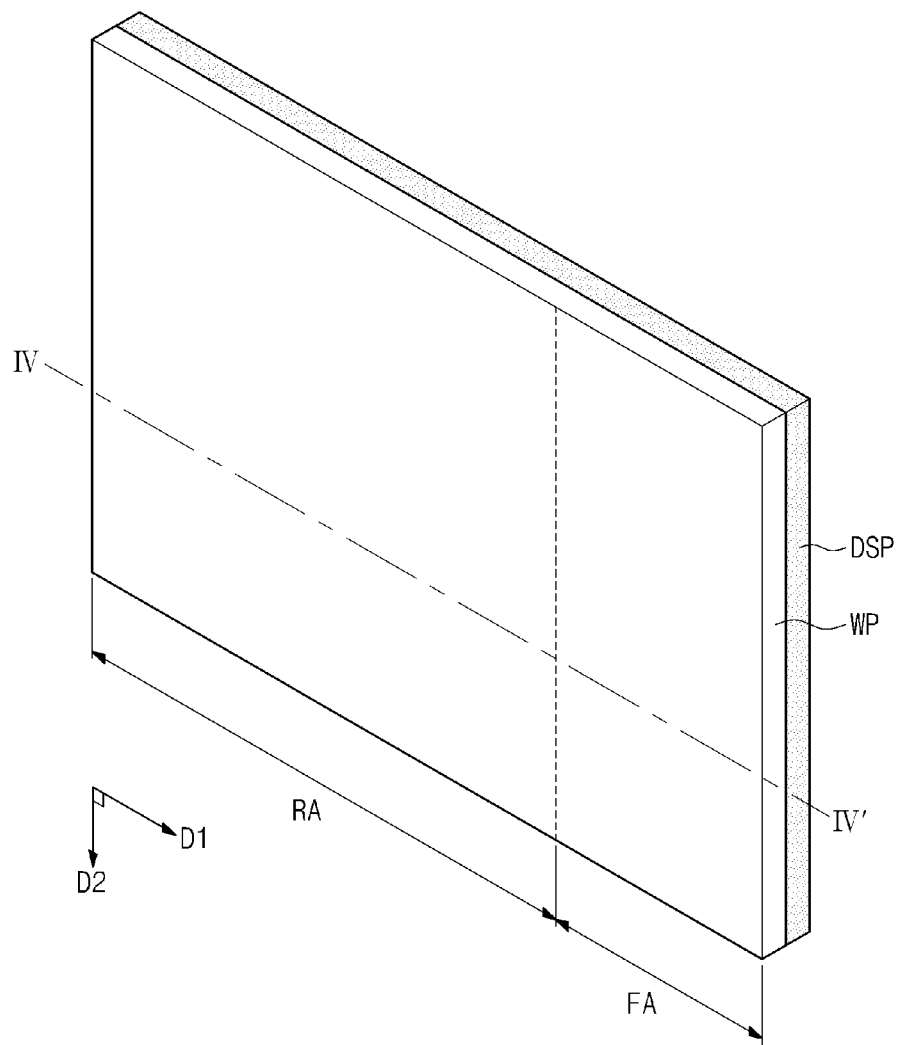
FIG. 15A is a perspective view illustrating a foldable display device according to still yet another exemplary embodiment.

According to some embodiments, the flexible area is provided at an outermost region of a foldable display device, and thus, a portion of the foldable display device may have a rolled structure. FIG. 15A is a perspective view illustrating a foldable display device according to an exemplary embodiments, FIG. 15B is a perspective view illustrating the foldable display device of FIG. 15A in a rolled state, and FIG. 15C is a sectional view taken along a line IV-IV' of FIG. 15A to illustrate a window panel of the foldable display device of FIG. 15A.

Figure 15B:
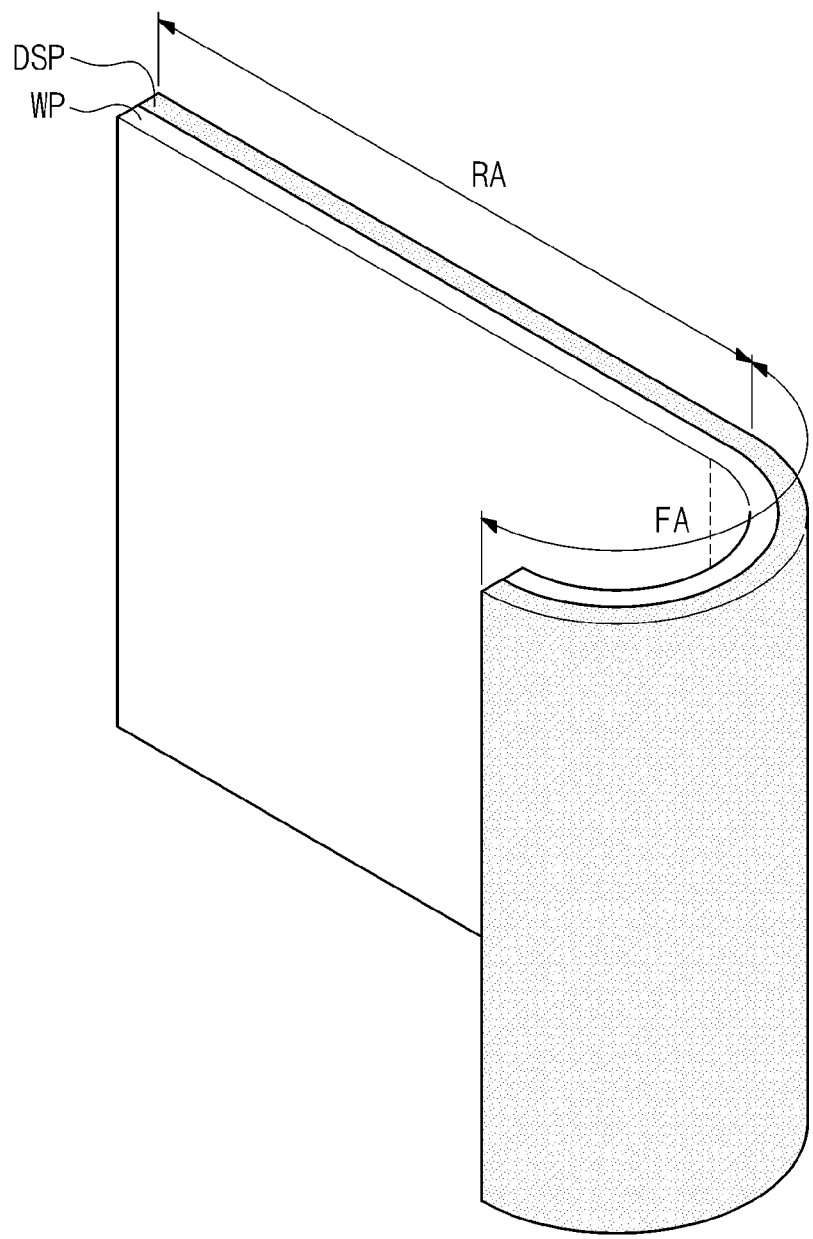
FIG. 15B is a perspective view illustrating the foldable display device of FIG. 15A in a rolled state.
Figure 15C:
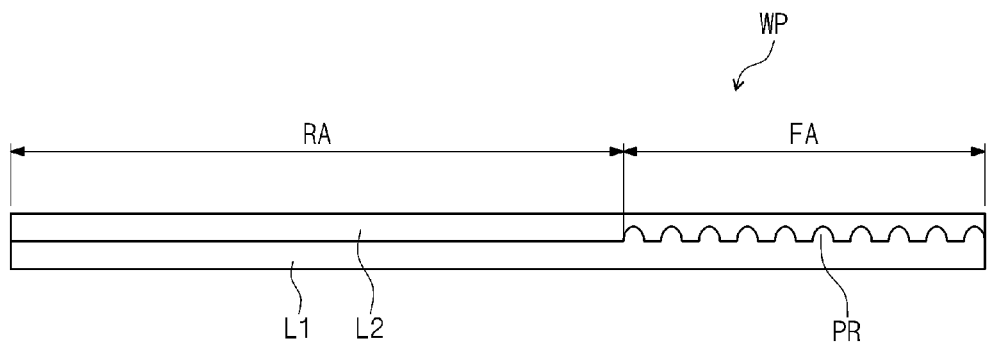
FIG. 15C is a sectional view taken along a line IV-IV' of FIG. 15A to illustrate a window panel of the foldable display device of FIG. 15A.

Referring to FIGS. 15A, 15B, and 15C, the window panel WP of the foldable display device includes a rigid area RA and a flexible area FA. The flexible area FA is provided at one side of the rigid area RA (for example, at the outermost portion of the foldable display device when viewed in the first direction D1). A plurality of convex portions PR are provided in the first layer L1 of the flexible area FA. Here, in the window panel WP, the convex portions PR may be provided to have a substantially uniform size and density, and thus, the flexible area FA may be substantially uniformly rolled. Alternatively, in the window panel WP, the size and density of the convex portions PR may be varied depending on a rolling direction of the foldable display device. Further, a position and a bending curvature of a portion to be rolled may be controlled by adjusting the area of the flexible area FA and the shape, density, and/or extending direction of the convex portions PR.

Figure 16:
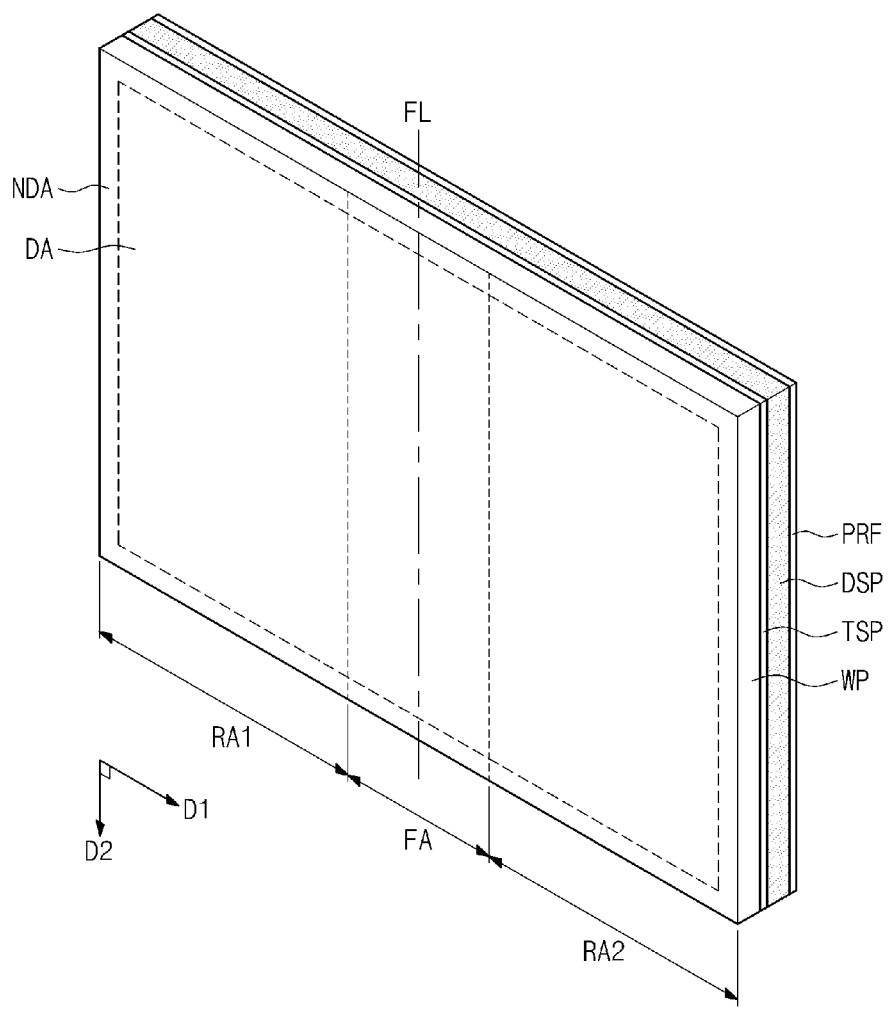
FIG. 16 is a perspective view of a foldable display device according to even another exemplary embodiment.

The foldable display device may further include an additional element, in addition to the display panel and the window panel. FIG. 16 is a perspective view of a foldable display device according to a further exemplary embodiment.

Referring to FIG. 16, the foldable display device includes the display panel DSP, window panel WP, a touch screen panel TSP provided between the display panel DSP and the window panel WP, and a protection film PRF provided on a back surface of the display panel DSP (for example, opposite to the touch screen panel TSP). The touch screen panel TSP detects touch events from a user and the protection film PRF protects the back side of the display panel DSP. At least one of the touch screen panel TSP and the protection film PRF may be omitted.

Although not shown, a functional layer (such as a hard coating layer for increasing durability of the window panel WP and protecting the window panel WP or an anti-reflection layer for substantially preventing light reflection) may be optionally provided on a surface of the window panel WP.

Figure 17A:
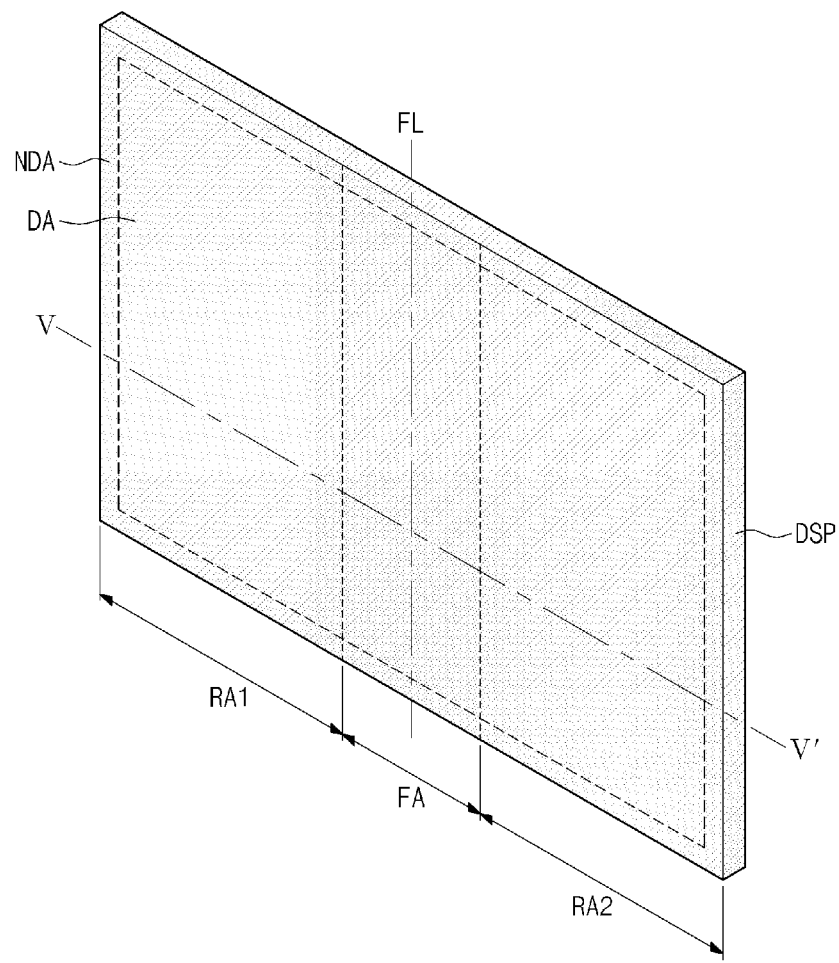
FIG. 17A is a perspective view illustrating a display panel of a foldable display device according to another exemplary embodiment.
Figure 17B:
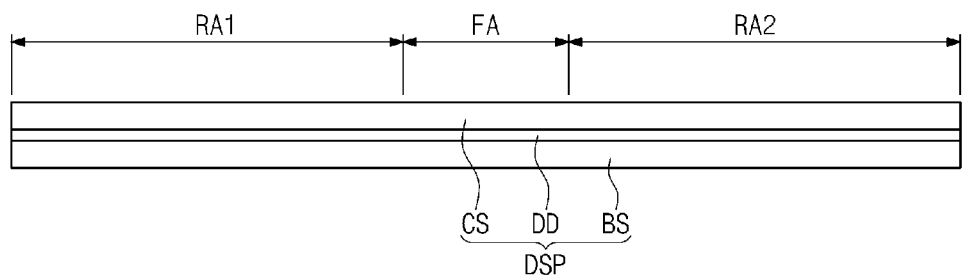
FIG. 17B is a sectional view taken along line V-V' of FIG. 17A.
Figure 17C:
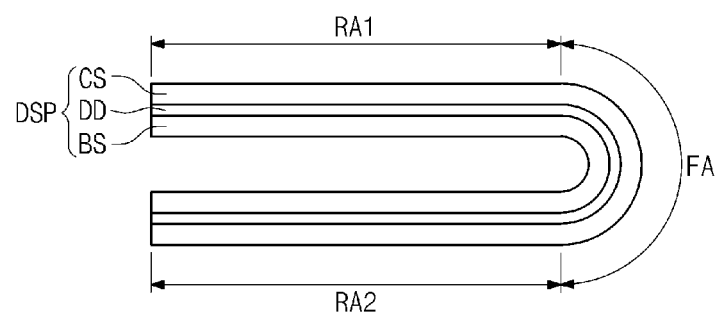
FIG. 17C is a sectional view illustrating the display panel of FIG. 17B in a folded state.

As described above, the foldable display device may include the display panel and the window panel, however, the described technology is not limited thereto. Elements corresponding to the window panel in the above described embodiments may be used as a substrate in the display panel, and in this case, the window panel may be optionally provided on the front surface of the display panel. FIG. 17A is a perspective view illustrating a display panel of a foldable display device according to another exemplary embodiment, FIG. 17B is a sectional view taken along a line V-V' of FIG. 17A, and FIG. 17C is a sectional view illustrating the display panel of FIG. 17B in a folded state.

The display panel DSP includes a base substrate BS and an image display layer DD provided on the base substrate BS.

The base substrate BS may have a shape corresponding to that of the display panel DSP. For example, the base substrate BS may have a substantially rectangular shape. The image display layer DD may include an image display layer provided on the base substrate BS and an encapsulation member facing the base substrate BS with the image display layer interposed therebetween.

The image display layer DD may be configured to display an image and may be any suitable type of display. For example, the image display layer DD may include one of a liquid crystal layer, an organic electroluminescence layer, an electrophoresis layer, or an electrowetting layer. At least one electrode may be provided in the image display layer DD to apply an electric field to the image display layer and thereby control whether an image is displayed or not.

The encapsulation member may protect the image display layer against any external impact and it may be provided to face the base substrate BS with the image display layer interposed therebetween. In exemplary embodiments, the encapsulation member may be formed of the same material as the base substrate BS and have substantially the same shape as the base substrate BS, thereby serving as an opposite substrate CS, however, the described technology is not limited thereto. For example, according to some embodiments, the encapsulation member is provided in the form of a thin film covering the image display layer. According to the present embodiment, the encapsulation member is substantially the same as the base substrate BS, in terms of material and shape.

The display panel DSP may include the flexible area FA, which is flexible, and at least one rigid area that is provided adjacent to at least one side of the flexible area FA, which is not flexible. In exemplary embodiments, as shown, the first rigid area RA1, the flexible area FA, and the second rigid area RA2 may be sequentially arranged along the first direction D1. The flexible area FA may extend in the second direction D2.

The foldable display device may be folded at the flexible area FA. In exemplary embodiments, the foldable display device is folded along the flexible area FA substantially parallel to the second direction D2 in such a way that the first and second rigid areas RA1 and RA2 face each other.

According to at least one embodiment, it is possible to significantly reduce the bending stress to be applied to the base substrate when compared to a conventional base substrate.

Each of the foldable display devices according to the above described embodiments may be used for a variety of applications. For example, they may be applied in a portable device, a smart phone, an electronic book, a laptop computer, a notebook computer, a tablet computer, a personal computer, or a billboard. However, the described technology is not limited thereto.

According to at least one embodiment, it is possible to improve the durability and flexibility of a foldable display device.

While exemplary embodiments of the described technology have been particularly shown and described, it will be understood by one of ordinary skill in the art that variations in form and detail may be made therein without departing from the spirit and scope of the appended claims.

What is claimed is:

1. A foldable display device, comprising: a display panel; and a window panel placed over the display panel, wherein the window panel includes: i) a flexible area and ii) a rigid area adjacent to at least one side of the flexible area, wherein the rigid area is less flexible than the flexible area, wherein the elastic modulus of the flexible area is less than that of the rigid area, and wherein the window panel comprises a plurality of layers including a first layer, wherein the first layer has an elastic modulus different from the other layers, and wherein the thicknesses of the first layer are different in the rigid area and in the flexible area.

2. The device of claim 1, wherein the window panel further includes a folding line along which the window panel is configured to be folded and wherein the flexible area extends along the folding line.

3. The device of claim 2, wherein the window panel further comprises a second layer, wherein the thicknesses of the second layer are different in the rigid area and in the flexible area, wherein the elastic modulus of the first layer is less than that of the second layer, and wherein the thickness of the first layer in the flexible area is greater than that of the second layer.

4. The device of claim 3, wherein the total thickness of the window panel is substantially uniform.

5. The device of claim 3, wherein the window panel comprises a third layer, wherein the elastic modulus of the third layer is greater than that of the second layer, and wherein the thickness of the third layer in the flexible area is less than that of the second layer.

6. The device of claim 3, wherein the first layer comprises a convex portion in the flexible area protruding toward the second layer.

7. The device of claim 6, wherein the convex portion extends in a direction substantially parallel to the folding line.

8. The device of claim 7, wherein the convex portion has a shape of a polygon, a portion of a circle, or a portion of an ellipse on a sectional view.

9. The device of claim 6, wherein the first layer further comprises a plurality of convex portions.

10. The device of claim 9, wherein the density of the convex portions decreases as the distance from the folding line increases.

11. The device of claim 9, wherein the heights of the convex portions decreases as the distance from the folding line increases.

12. The device of claim 3, wherein the first layer is formed of a polymer resin.

13. The device of claim 12, wherein the polymer resin comprises an acrylic or silicone resin.

14. The device of claim 3, wherein the second layer is formed of at least one of polyimide, polycarbonate, poly(methyl methacrylate), polyethersulfone, polyamide, polyamide imide, or polycarbonate-poly(methyl methacrylate).

15. The device of claim 1, wherein the display panel comprises a liquid crystal display panel, an organic electroluminescence display panel, an electrophoresis display panel, or an electrowetting display panel.

16. The device of claim 15, wherein the display panel further comprises a touch screen panel.

17. The device of claim 1, wherein the display panel comprises a display area and a non-display area adjacent to at least one side of the display area, wherein at least a portion of the flexible area substantially overlaps the display area.

18. The device of claim 1, wherein the display panel comprises a display area and a non-display area adjacent to at least one side of the display area, and wherein the flexible area substantially overlaps the non-display area.

19. A foldable display device, comprising:
a base substrate comprising a flexible area and a rigid area adjacent to at least one side of the flexible area, wherein the rigid area is less flexible than the flexible area; and
an image display layer formed over the base substrate, wherein the elastic modulus of the flexible area is less than that of the rigid area, and
wherein the base substrate comprises a plurality of layers including a first layer, wherein the first layer has an elastic modulus different from the other layers, and wherein the thicknesses of the first layer are different in the rigid area and in the flexible area.

20. The device of claim 19, wherein the base substrate further comprises a folding line along which the base substrate is configured to be folded and wherein the flexible area extends along the folding line.

21. The device of claim 20, wherein the base substrate further comprises a second layer, wherein the thicknesses of the second layer are different in the rigid area and in the flexible area, wherein the elastic modulus of the first layer is less than that of the second layer, and wherein the thickness of the first layer in the flexible area is greater than that of the second layer.

22. The device of claim 21, wherein the base substrate comprises a third layer, wherein the elastic modulus of the third layer is greater than that of the second layer, and wherein the thickness of the third layer in the flexible area is less than that of the second layer.

23. The device of claim 21, wherein the first layer comprises a convex portion in the flexible area protruding toward the second layer.

24. The device of claim 23, wherein the convex portion extends in a direction substantially parallel to the folding line.

25. The device of claim 24, wherein the convex portion has a shape of a polygon, a portion of a circle, or a portion of an ellipse on sectional view.

26. The device of claim 23, wherein the first layer further comprises a plurality of convex portions.

27. The device of claim 26, wherein the density of the convex portions decreases as the distance from the folding line increases.

28. The device of claim 26, wherein the heights of the convex portions decreases as the distance from the folding line increases.

29. The device of claim 19, further comprising an encapsulation member encapsulating the image display layer.

30. The device of claim 29, wherein the image display layer comprises a liquid crystal display layer, an organic electroluminescence layer, an electrophoresis layer, or an electrowetting layer.

31. The device of claim 29, wherein the encapsulation member comprises an opposite substrate facing the base substrate and wherein the encapsulation member is spaced apart from the base substrate with the image display layer interposed therebetween.

32. The device of claim 31, wherein the opposite substrate comprises a flexible area and a rigid area adjacent to at least one side of the flexible area, wherein the flexible and rigid areas of the opposite substrate are formed substantially directly above those of the base substrate, and wherein the opposite substrate has a lower elastic modulus in the flexible area than that in the rigid area.

33. A foldable display device, comprising: a display panel; and a window panel comprising first and second layers formed over the display panel, wherein the window panel includes a flexible area and a rigid area adjacent to at least one side of the flexible area, wherein the rigid area is less flexible than the flexible area, wherein the elastic modulus of the first layer is less than that of the second layer, and wherein the thickness of the first layer is greater in the flexible area than in the rigid area.

34. The foldable display device of claim 33, wherein the total thickness of the window panel is substantially uniform.

* * * * *